(12) United States Patent
Liu et al.

(10) Patent No.: US 10,170,315 B2
(45) Date of Patent: Jan. 1, 2019

(54) SEMICONDUCTOR DEVICE HAVING LOCAL BURIED OXIDE

(71) Applicant: GLOBALFOUNDRIES Inc., Grand Cayman (KY)

(72) Inventors: Yanxiang Liu, Wappingers Falls, NY (US); Min-hwa Chi, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 980 days.

(21) Appl. No.: 13/943,849

(22) Filed: Jul. 17, 2013

(65) Prior Publication Data

US 2015/0024557 A1 Jan. 22, 2015

(51) Int. Cl.
| | |
|---|---|
| *H01L 29/66* | (2006.01) |
| *H01L 21/265* | (2006.01) |
| *H01L 21/8238* | (2006.01) |
| *H01L 29/49* | (2006.01) |
| *H01L 29/78* | (2006.01) |
| *H01L 29/10* | (2006.01) |

(52) U.S. Cl.
CPC ......... *H01L 21/26533* (2013.01); *H01L 21/823878* (2013.01); *H01L 29/1033* (2013.01); *H01L 29/1079* (2013.01); *H01L 29/4966* (2013.01); *H01L 29/6659* (2013.01); *H01L 29/66583* (2013.01); *H01L 29/7833* (2013.01)

(58) Field of Classification Search
CPC ......... H01L 29/66742; H01L 29/66477; H01L 29/78

USPC ..... 257/347, 213, 349, 350, E21.564, E21.7, 257/E29.285; 438/151, 155, 282, 758
See application file for complete search history.

(56) References Cited

U.S. PATENT DOCUMENTS

| | | | |
|---|---|---|---|
| 4,997,786 A | * | 3/1991 | Kubota ............ H01L 21/76243 257/E21.563 |
| 5,061,642 A | | 10/1991 | Fujioka |
| 5,888,297 A | | 3/1999 | Ogura |
| 6,420,218 B1 | | 7/2002 | Yu |
| 8,445,337 B2 | | 5/2013 | Bangsaruntip et al. |
| 8,445,963 B2 | | 5/2013 | Jakschik et al. |
| 8,461,647 B2 | | 6/2013 | Chou et al. |
| 8,469,886 B2 | | 6/2013 | Brauker et al. |
| 8,482,069 B2 | | 7/2013 | Yamazaki et al. |
| 8,486,736 B2 | | 7/2013 | Yokoyama et al. |
| 8,507,989 B2 | | 8/2013 | Khakifirooz et al. |
| 8,517,275 B2 | | 8/2013 | Tsuchiya |

(Continued)

OTHER PUBLICATIONS

Liu et al., "Finfet Semiconductor Device Having Local Buried Oxide", U.S. Appl. No. 14/083,164, filed Nov. 18, 2013, 25 pages.

(Continued)

*Primary Examiner* — Fernando L Toledo
*Assistant Examiner* — Lawrence-Linh T Nguyen
(74) *Attorney, Agent, or Firm* — Heslin Rothenberg Farley & Mesiti P.C.; Stephen Scuderi

(57) ABSTRACT

There is set forth herein a semiconductor device fabricated on a bulk wafer having a local buried oxide region underneath a channel region of a MOSFET. In one embodiment the local buried oxide region can be self-aligned to a gate, and a source/drain region can be formed in a bulk substrate. A local buried oxide region can be formed in a semiconductor device by implantation of oxygen into a bulk region of the semiconductor device followed by annealing.

22 Claims, 7 Drawing Sheets

(56) References Cited

U.S. PATENT DOCUMENTS

| | | |
|---|---|---|
| 8,519,479 B2 | 8/2013 | Bangsaruntip |
| 8,531,000 B2 | 9/2013 | Yoneda |
| 8,536,650 B2 | 9/2013 | Cheng et al. |
| 8,546,246 B2 | 10/2013 | Lin et al. |
| 8,551,313 B2 | 10/2013 | Basker et al. |
| 8,558,370 B2 | 10/2013 | Sugiyama et al. |
| 8,564,025 B2 | 10/2013 | Bangsaruntip et al. |
| 8,574,970 B2 | 11/2013 | Cheng et al. |
| 8,575,694 B2 | 11/2013 | Huo et al. |
| 8,575,699 B2 | 11/2013 | Chan et al. |
| 2006/0027870 A1 | 2/2006 | Inaba |
| 2006/0084215 A1 | 4/2006 | Hieda et al. |
| 2007/0122984 A1 | 5/2007 | Zhu et al. |
| 2008/0135935 A1* | 6/2008 | Cho ............... H01L 21/845 257/347 |
| 2008/0237655 A1 | 10/2008 | Nakabayashi et al. |
| 2009/0224321 A1 | 9/2009 | Tsuchiya |
| 2011/0084315 A1* | 4/2011 | Bedell et al. ............ 257/213 |
| 2012/0061759 A1* | 3/2012 | Cheng et al. ............ 257/347 |
| 2012/0104498 A1 | 5/2012 | Majumdar et al. |
| 2013/0119466 A1 | 5/2013 | Chung et al. |
| 2013/0122665 A1 | 5/2013 | Chan et al. |
| 2013/0127049 A1 | 5/2013 | Wang et al. |
| 2013/0140639 A1 | 6/2013 | Shieh et al. |
| 2013/0146953 A1 | 6/2013 | Cheng et al. |
| 2013/0146959 A1 | 6/2013 | Cheng et al. |
| 2013/0149823 A1 | 6/2013 | Bedell et al. |
| 2013/0155382 A1 | 6/2013 | Inoue |
| 2013/0193916 A1 | 8/2013 | Koyama |
| 2013/0200438 A1 | 8/2013 | Liu et al. |
| 2013/0207187 A1 | 8/2013 | Huo et al. |
| 2013/0260505 A1 | 10/2013 | Bedell et al. |
| 2013/0270640 A1 | 10/2013 | Sagae et al. |
| 2013/0320294 A1 | 12/2013 | Cappellani et al. |
| 2014/0167163 A1 | 6/2014 | Cheng et al. |
| 2014/0264596 A1 | 9/2014 | He et al. |
| 2014/0361338 A1 | 12/2014 | Kerber et al. |

OTHER PUBLICATIONS

Jun. 2, 2015 Final Office Action in U.S. Appl. No. 14/083,164.
USPTO Office Action dated Feb. 24, 2015; for Co-Owned U.S. Appl. No. 14/083,164.

* cited by examiner

SEMICONDUCTOR DEVICE HAVING LOCAL BURIED OXIDE

BACKGROUND OF THE INVENTION

Extremely thin Silicon-On-Insulator (ETSOI) planar Metal Oxide Silicon Field Effect Transistors (MOSFETs) are desirable for many aspects. Such structures provide fully depleted devices having planar architectures with superior short channel control, low junction leakage current, and an un-doped body with low variability from random dopant fluctuations. Thin body semiconductor devices have limitations, however, in that they are not well adapted for stress inducement in the channel (or body) for carrier mobility enhancement. Also, source/drain resistance tends to be too high due to thin Silicon (Si) layer (i.e., small amount of Si materials) for many applications.

In one proposed solution for inducing stress to a channel and reducing source/drain resistance, the structure of raised sources and drains can be formed using Si epitaxial growth. However, the added stress in a channel of a MOSFET on ETSOI by using such methods can still be minimal and the source and drain resistance is still too high for many applications which typically employ MOSFETs formed on a bulk Si substrate.

BRIEF SUMMARY

There is set forth herein a semiconductor device fabricated on a bulk wafer having a local buried oxide region underneath a channel region of a MOSFET. In one embodiment the local buried oxide region can be self-aligned to a gate, and a source/drain region can be formed in a bulk substrate. A local buried oxide region can be formed in a semiconductor device by implantation of oxygen into a bulk region of the semiconductor device followed by annealing.

BRIEF DESCRIPTION OF SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
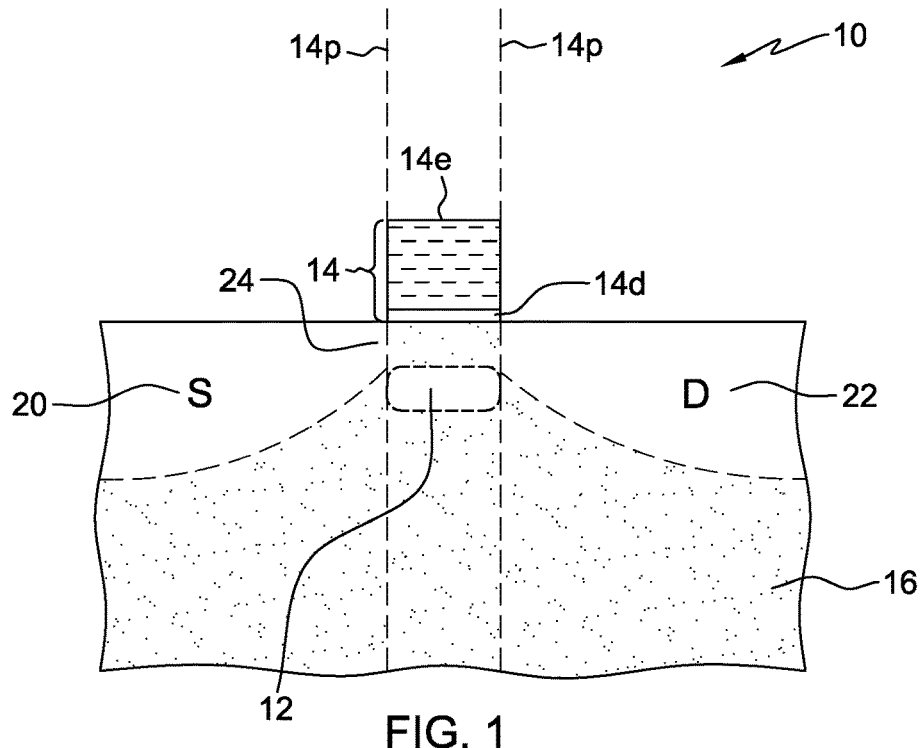
FIG. 1 is a cut away side view of a semiconductor device having a local buried oxide region.

As shown in FIG. 1 a semiconductor device 10 can include a local buried oxide region 12 aligned with a gate 14 and below a surface of Si substrate 16. A channel 24 can be defined between gate 14 and local buried oxide region 12. Local buried oxide region 12 can be referred to as "BOX". Local buried oxide region 12 can be formed in bulk Si substrate 16 by implantation of oxygen into Si substrate 16 and followed by annealing.

Gate 14 can include a gate electrode 14e and a gate dielectric 14d. Each of gate electrode 14e and gate dielectric 14d can include one or more layers. Gate 14 can be regarded as a gate stack. Gate dielectric 14d can be disposed between gate electrode 14e and bulk Si substrate 16. Gate dielectric 14d provides gate control (i.e., capacitive coupling between gate electrode 14e and channel 24) to induce or deplete charge carriers in the channel 24 for turning on and off of the device. Gate dielectric 14d can block the leakage of charges between gate electrode 14e and bulk Si substrate 16. Source and drain regions 20 and 22 can be formed in bulk Si region 16 via ion implantation.

Figure 2:
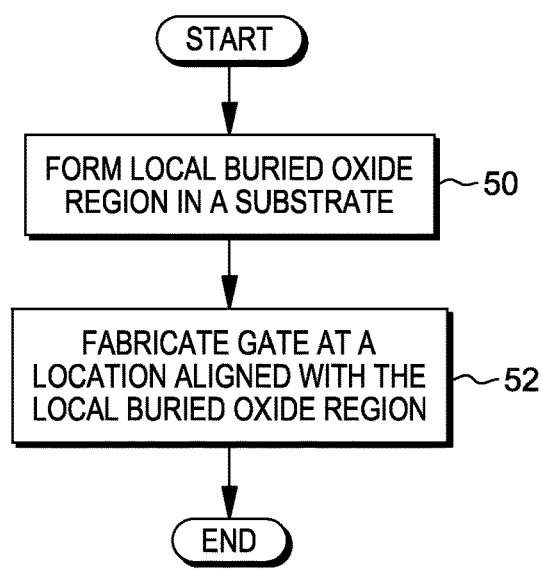
FIG. 2 is a flow diagram illustrating a method including forming a local buried oxide region.

A method is shown in FIG. 2. At block 50 there is formed a local buried oxide region 12 in a silicon substrate 16. At block 52 there is formed a gate 14 at a location aligned with the local buried oxide region 12. In one embodiment as is shown in FIG. 1, local buried oxide region 12 is vertically aligned with gate 14 and does not extend outwardly laterally beyond the vertically extending planes 14p as shown in FIG. 1.

Figure 3:
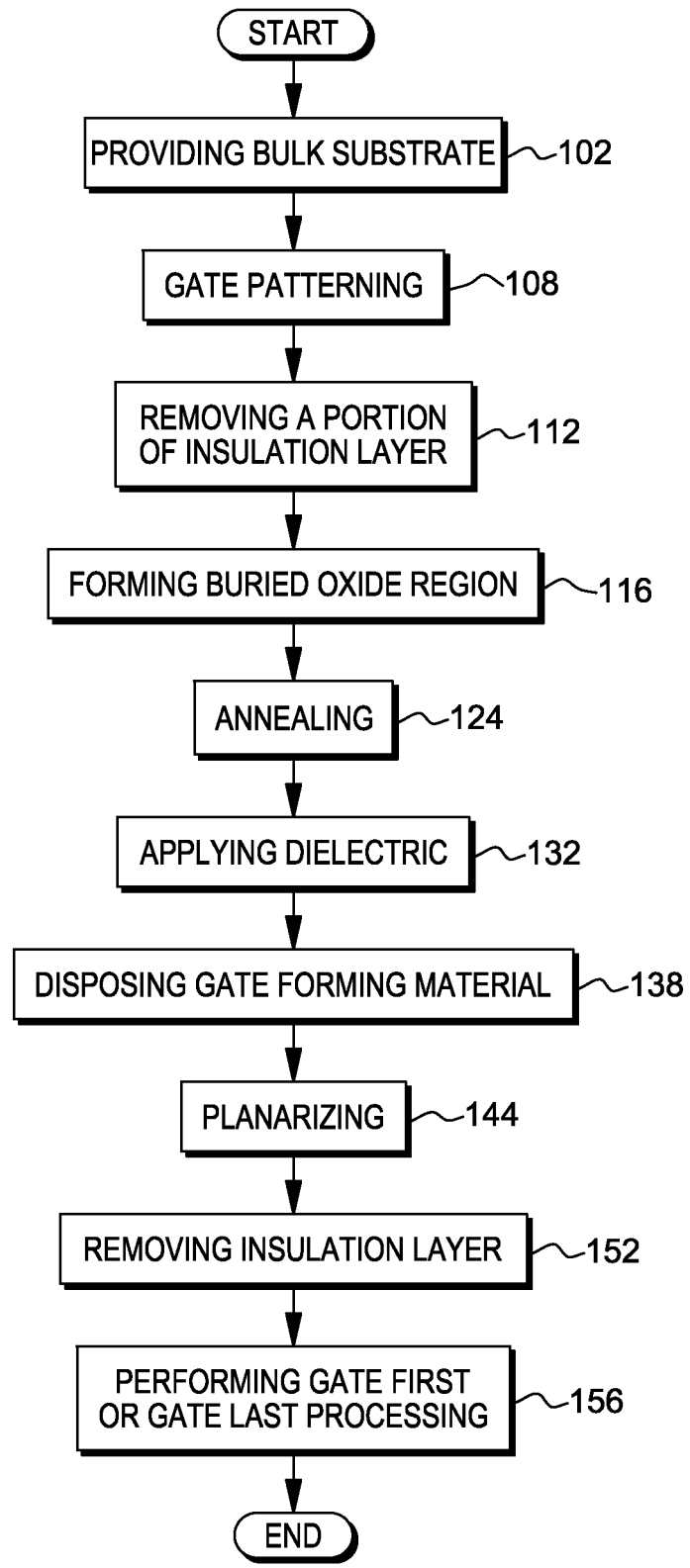
FIG. 3 is a flow diagram illustrating fabrication of a semiconductor device.
Figure 4:
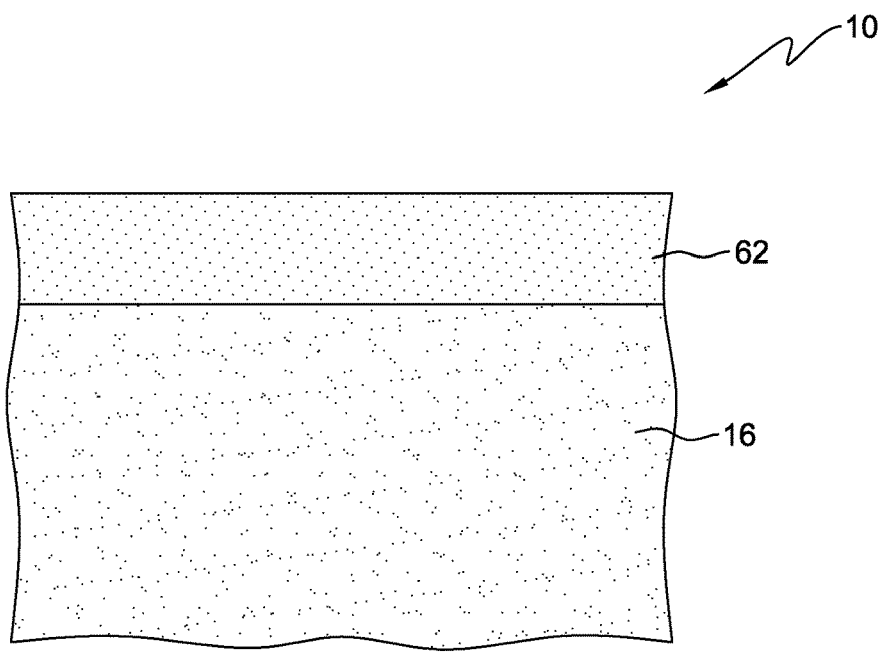
FIGS. 4-12 are side view schematic diagrams illustrating fabrication of a semiconductor device.

A method for formation of a semiconductor device using the method of FIG. 2 is shown in FIG. 3. At block 102 there is provided a bulk substrate with an insulation layer deposited thereon. At block 102 in reference to FIG. 4 the providing can include providing a Si substrate and depositing thereon an insulation layer 62. In one embodiment, the insulation layer 62 can be e.g., a silicon nitride (SiN) layer as depicted in FIG. 4. The providing at block 102 can alternatively include providing a Si substrate and depositing thereon insulation layer 62 in other form, e.g., a Si-oxide layer or a combination of Si-nitride and Si-oxide layers. The thickness of the insulation layer 62 can be in the range of 10-100 nm. The providing at block 102 can also include shallow trench isolation (STI) and formation of n-well and p-well.

Figure 5:
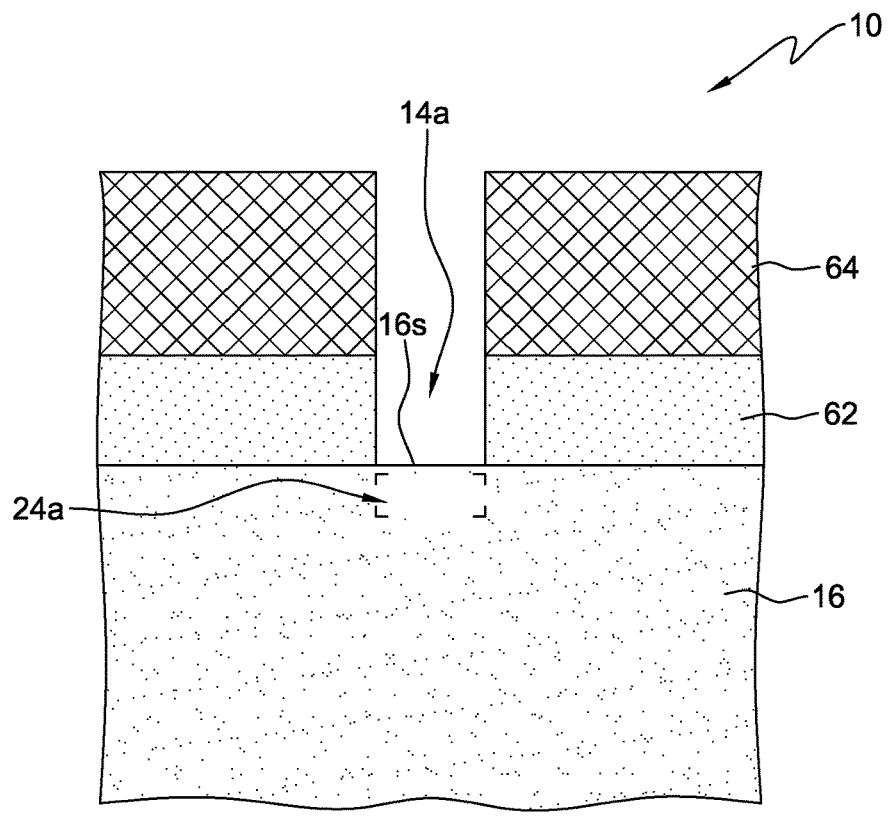

At block 108 in reference to FIG. 5 there can be performed gate patterning for providing an opening (to allow for Oxygen ion implantation in subsequent step). In one embodiment, the gate patterning can include providing a mask 64, the mask 64 having a two dimensional area pattern that defines a gate area 14a and a channel area 24a of device 10. Channel area 24a in the specific embodiment described is a cross sectional view of the channel 24 vertically aligned with gate area 14a.

At block 108, also in reference to FIG. 5 there can be performed removal of material of insulation layer 62 until surface 16s is exposed at the interface to the gate area 24a. To remove material of insulation layer 62, e.g., Si-nitride and/or Si-oxide, an etching by wet or dry methods can be performed. In one embodiment etching can include e.g., reactive ion etching (RIE).

Figure 6:
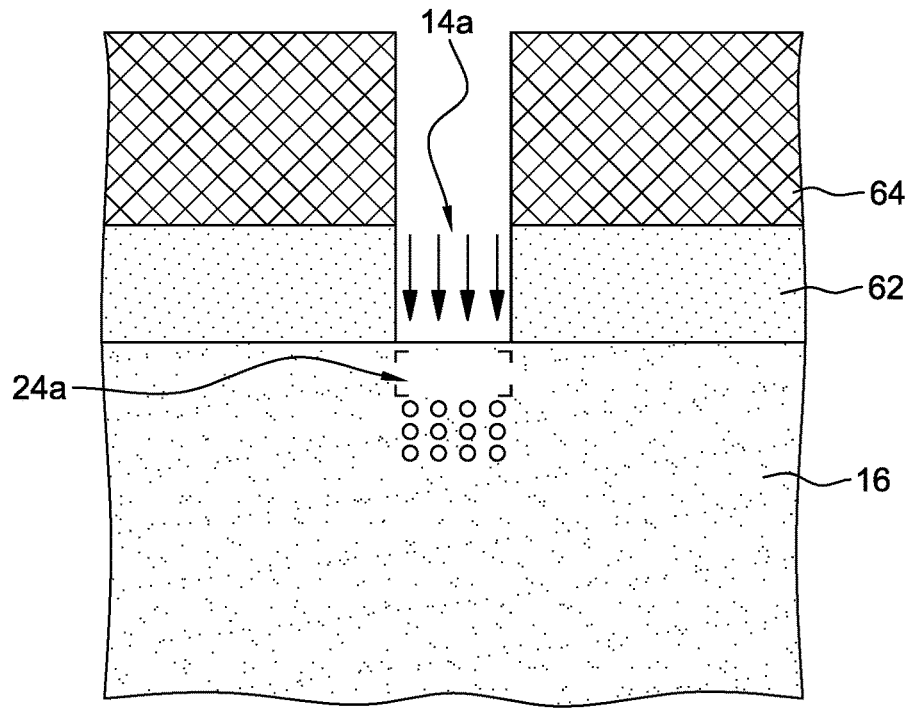

At block 116 in reference to FIG. 6, there can be formed a local buried oxide region 12 in a substrate. Forming of a local buried oxide region 12 can be performed using ion implantation of oxygen ($O^+$) through an exposed surface 16s of Si substrate 16 into an area within substrate below channel region and followed by thermal annealing. In one embodiment, the implantation of oxygen ions can be accompanied by implantation of one or more of Nitrogen (N), Carbon (C) and Fluorine (F). The energy and dose of implantation of one or more of oxygen ions, N, C, and F is designed to form a local buried oxide region (BOX) deep enough underneath the Si interface 16s, so that dopant diffusion is reduced and stress at local buried oxide region 12 and surrounding areas of Si substrate 16 is reduced. In one embodiment, the local buried oxide region 12 can be 20 nm-40 nm beneath the surface 16s of Si substrate 16 (i.e., a 20-40 nm thin silicon layer as similar to the thin Si layer in ETSOI for serving as the channel 24a for MOSFET). In one embodiment, the ion implantation can include implantation of oxygen (with dose in the range of $10^{15}$ to $10^{17}$ cm$^{-2}$) with small percentages (1.0%-3.0%) of Nitrogen (N), Carbon (C), or Fluorine (F). In one embodiment, mask 64 defines both an area of implantation of oxygen ions, and in a manner set forth herein, an area of gate electrode material trench fill. In such manner a formed gate 14 is self aligned to a channel 24 and local buried oxide region 12.

According to one prior art method for the fabrication of a commercially available Silicon on Insulator (SOI) substrate, a method known as Separation by Implantation of Oxygen (SIMOX) can be employed. The SIMOX method performs Oxygen implant into bulk Si-substrate in blank (i.e., no photoresist pattern) with high dose (>$10^{18}$ cm$^{-2}$) and at elevated temperature (>600° C.) during implantation and then followed by a post implant annealing at high temperature (>1200° C.) to eliminate defects and re-crystallize the surface, so that a Si-On-Insulator (SOI) substrate is formed. In one method in this disclosure for the formation of a local buried oxide region 12, Oxygen implant is performed in a localized area through a patterned mask 64 and with a lower dosage and no elevated temperature during implantation and also lower annealing temperature after implantation than in the case of a SIMOX for SOI substrate fabrication. According to one embodiment, the oxygen implantation for the formation of local buried oxide region 12 is at a dosage of about $10^{16}$ to $10^{17}$ ions/cm$^2$, which is about 1% to 10% of the known blank implant of oxygen at elevated temperature in the SIMOX technology method for forming SOI substrate. The post implant annealing temperature in this disclosure is in a range 800-1100° C. which is significantly lower than that for the SIMOX SOI substrate fabrication method due to the lower dose as well as the species of N, C, F co-implanted with Oxygen.

Figure 7:
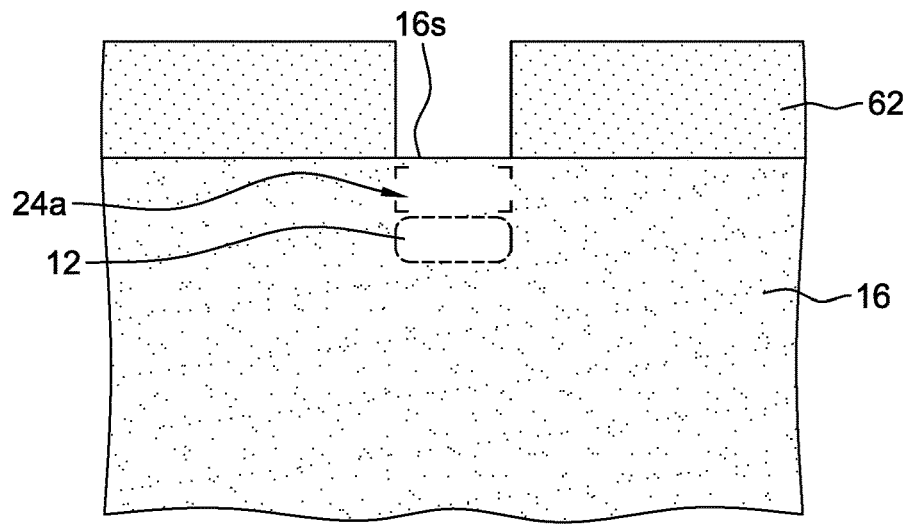

At block 124 in reference to FIG. 7 there can be performed the post implant high temperature annealing after removing the mask 64. High temperature annealing at block 124 can be performed subsequent to implantation of oxygen at block 116. The high temperature annealing can be performed e.g., at 800-1100 deg. C. in inert ambient to form a local buried oxide region 12 (box) and heal the damage in the silicon channel from the implantation at block 116. By comparison, post implantation annealing temperatures seen in SIMOX for SOI substrate fabrication processes are in the range of >1200 C. The implant of additives (N, C, F) with oxygen ions helps to suppress the generation of defects during post implant thermal annealing and also lower than the annealing temperature significantly. The implantation of the noted additives (N, C, F) also provides smooth stress transition between the local buried oxide region 12 and surrounding Si channel area 24a formed in substrate 16. Thus, a post implant annealing temperature lower than that in SIMOX for SOI substrate fabrication can result in a robust "defect free" and minimum stress around the Si channel 24 (FIG. 1). Furthermore, inclusion of one or more of the noted additives N, C, and F can suppress dopants of B, P, diffusion into the local buried oxide region 12 from an adjacent channel and Si substrate, so that there is provided reduced fluctuations of device parameters.

Figure 8:
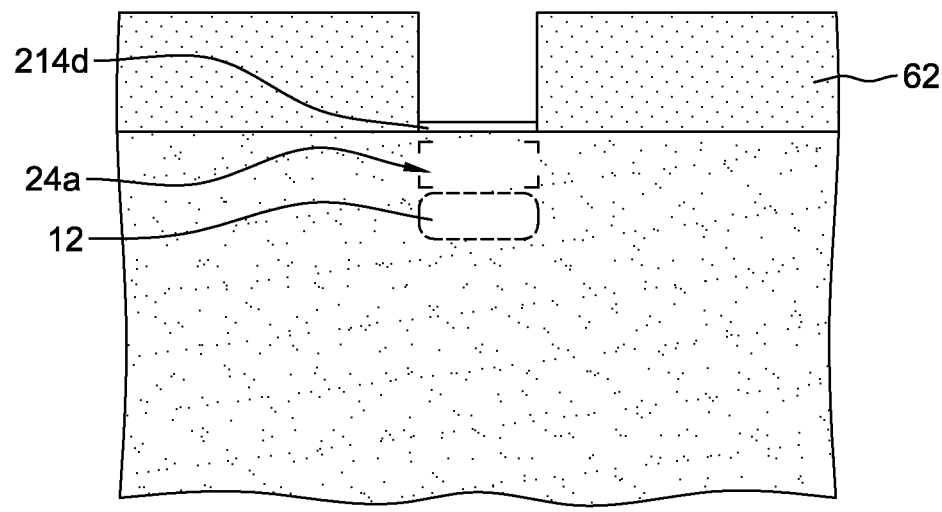

At block 132 in reference to FIG. 8 there can be deposited a gate dielectric layer 214d. Dielectric layer 214d can be e.g., an oxide layer or a high-k gate dielectric layer (typically HfO$_2$ based), or a combination. The oxide depositing can include depositing SiO$_2$ thermally or chemically. Where dielectric layer 214d is a high-k dielectric layer, the high-k is typically HfO$_2$ based and deposited on top of the SiO$_2$. In another embodiment the deposited high-k material may also be deposited on the sidewall of the gate electrode opening in insulation layer 62 and the surface of insulation layer 62 with thinner thickness. In a "gate first" flow, dielectric layer 214d serves as the final gate-dielectric. In the gate-last flow, the dielectric layer 214d can serve as an etch stop layer when gate forming material (e.g., poly-silicon shown in FIG. 9) is removed to allow for depositing of a final gate dielectric layers. Aspects of "gate-first" and gate-last" MOSFET fabrication methods are set forth herein.

Figure 9:
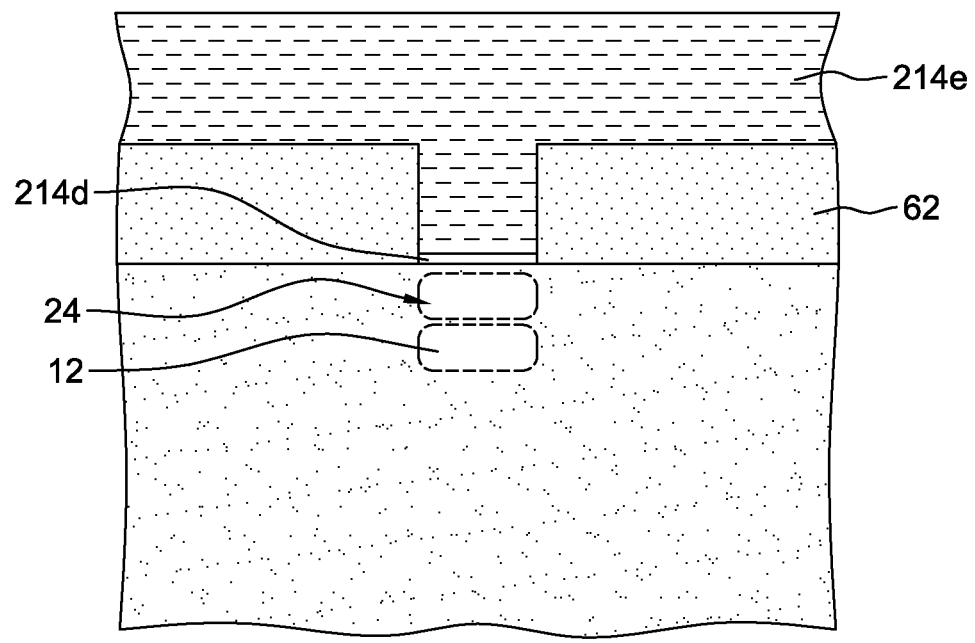

At block 138 in reference to FIG. 9 gate electrode material 214e can be deposited. The depositing at block 138 can include depositing poly-silicon. In one embodiment, the thickness of the gate electrode material can be sufficient (~200 A overfill above the surface of insulation layer 62) so that a gate area 14a is fully filled with poly-silicon. Gate electrode material 214e in the case of a "gate first" process flow defines the final gate electrode, e.g., the gate electrode 14e as depicted in FIG. 1. Gate electrode material 214e in the case of a "gate last" process flow will be removed to allow for depositing of the final gate electrode material (e.g., multiple layers of conducting materials of TiN, TaN, TiAl, TiC, Al, and W) defining the gate electrode 14e as shown in FIG. 1. With the depositing of gate electrode material 214e aligned to local buried oxide region 12, a channel 24 is defined as in FIG. 9.

Figure 10:
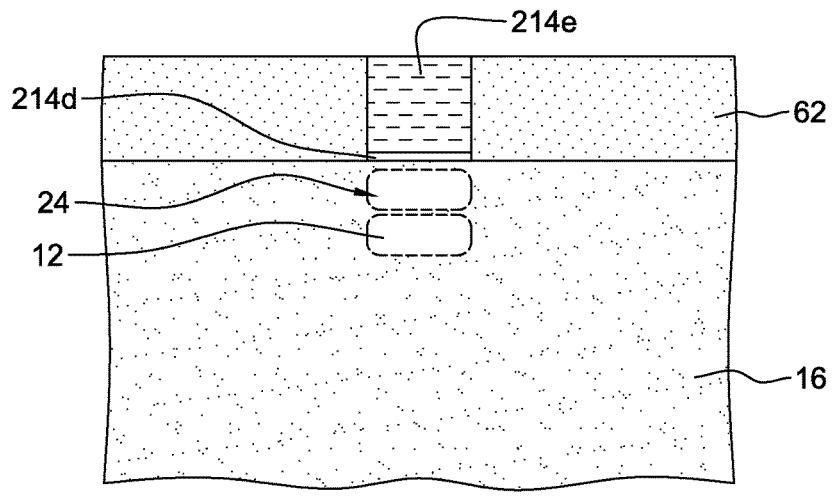

At block 144 in reference to FIG. 10 there can be performed chemical-mechanical planarization (CMP) to planarize the gate electrode material 214e and the insulation layer 62. At block 144 a gate height is essentially determined by a thickness of the insulation layer 62. In general, the gate electrode material 214e can be "softer" than a material of insulation layer 62. Accordingly, CMP can be "stopped" at the insulation layer 62 with only a small loss of material of the insulation layer 62, thus the insulation layer 62 can be regarded as a CMP stopping layer.

Figure 11:
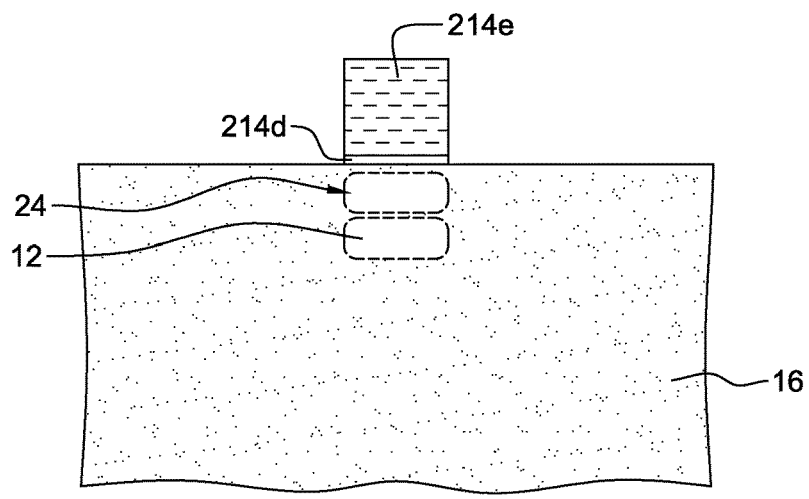

At block 152 insulation layer 62 (SiN or Si-oxide or combination) can be removed until a surface 16s of Si substrate 16 is exposed as is depicted in FIG. 11. The removal of insulation layer 62 which can be provided by a SiN layer can be performed using wet chemical etching e.g., etching using phosphorous acid which is selective to Si-oxide. Accordingly, an insulation layer 62 can be selectively removed as illustrated in FIG. 11. Subsequent to the removal of a remainder of insulation layer 62, process flow can continue according to a gate first or gate last process flow as set forth herein.

At block 156 a gate last or gate first process flow can be performed for completion of the semiconductor device. Aspects of both a gate first and gate last semiconductor device fabrication process flow are set forth herein.

Figure 12:
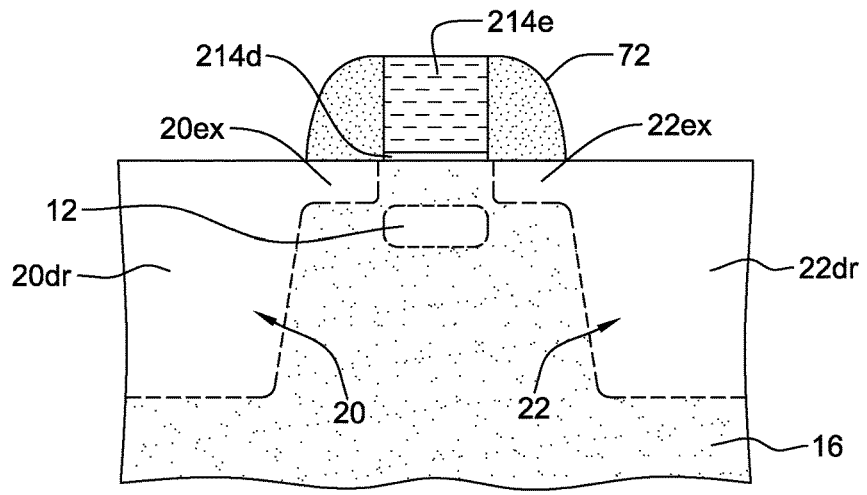

Aspects of a gate first process are now described for completeness. In a typical gate first process, gate electrode material 214e provided in the specific example herein by poly-silicon is used as a final gate electrode, e.g., as in a final gate electrode 14e as set forth in FIG. 1. Further to a "gate first" process appropriate ion implantation can be performed to form the extensions 20ex and 22ex of source 20 and drain 22 as shown in FIG. 12. Appropriate ion implantation can also be performed for formation of Halos (not shown) which in one embodiment can occupy, when formed, a portion of an area occupied by local buried oxide region 12.

Further to aspects of a "gate first" flow an offset spacer 72 can be formed on the edge of gate electrode material 214e provided by poly-silicon to aid in the formation of source 20 and drain 22. Offset spacer 72 as illustrated in FIG. 12 defines a location of Halo implantation for formation of the source and drain extensions 20ex and 22ex. Offset spacer 72 also defines a location for ion implantation deeper than that for extensions 20ex and 22ex for formation of the deep regions 20dr and 22dr of source and drain 20 and 22. Rapid thermal annealing (RTA) can then be performed as an optional process aspect (depending on specific integration need). Formation of the source and drain 20 and 22 including their extensions 20ex and 22ex can also be formed by ion implantations as typical processes performed in a bulk CMOS process or embedded silicon germanium (eSiGe) by selective epi-growth as a PFET stress booster, and SMT or carbon doped Si as an NFET stress booster.

A "gate first" flow can be completed by inter-layer dielectric (ILD) filling and planarized by CMP, middle of the line (MOL) silicide and contact formation, as well as BEOL processes. With a gate first flow a gate firstly defined by the depositing of gate electrode material 214e at block 138 is preserved and used as the final gate electrode. An example of a final gate electrode is gate electrode 14e as shown in FIG. 1. While the particular example of a gate first flow is illustrated by using poly-Si gate electrode, the poly-Si gate electrode material can be replaced by e.g., "metal-gate" materials using multiple layers of conducting materials e.g., TiN, TaN, TiAl, Al, or W, or combination of these as used in advanced CMOS mode at 32 nm and beyond.

Aspects of a gate last process are now described. The flow can proceed in the manner of the gate first process, through poly-gate patterning, oxygen ion implantation and annealing for local BOX formation, removal of insulation layer 62, formation of offset spacers 72 as are illustrated in FIG. 12, ion implantation to form source and drain extensions 20ex and 22ex, ion implantation processes for formation of Halos (not shown in FIG. 12) as well as deep source and drain 20dr and 22dr, inter-metal dielectric, and (ILD) filling and planarized by CMP, as indicated in FIG. 12. One or more of the above processes can be optionally deleted.

According to a "gate last" process flow, CMP planarization as set forth hereinabove can be followed by etch back to remove the "dummy" poly-silicon gate electrode material 214e as shown in FIG. 12. Removal of gate electrode material 214e can be followed by high-k dielectric deposition and deposition of metal gate layers (e.g., TiN, TaN, TiAl, TiC, Al, and W or combination for setting the work-function of device) then a metal chemical-mechanical planarization CMP can be performed. Typical processes of silicidation, contact formation, and back end of line (BEOL) for CMOS can then be performed. The above flow is commonly regarded as a gate last (or replacement gate) process in that the initial poly-silicon gate electrode material 214g is removed (as a dummy or "sacrificial" gate) and the gate electrode is formed at last after the source and drain 20 and 22 formation. In one embodiment of a gate last process flow, dielectric layer 214d with "a dummy gate" electrode provided by gate electrode material 214e is removed and replaced. In another embodiment of a "gate last" process flow gate electrode material 214e is removed and replaced; however, dielectric layer 214d is not removed and instead serves as final gate dielectric layer 14d, e.g., as set forth in the example of FIG. 1.

Further aspects are now described with reference to FIG. 1. It is seen that local buried oxide region 12 is formed only under the gate 14 and a well controlled channel 24 but not under a source and drain 20 and 22. Such local buried oxide underneath a defined channel 24 can effectively eliminate the leakage current between the source 20 and drain 22 (i.e., similar to the advantage exhibited as in the case of a MOSFET fabricated on SOI substrate, e.g., ETSOI device). In one embodiment, the depth of channel 24 can be controlled to be at an "extremely thin" depth, e.g., less than or equal to 10 nm depth. In another embodiment, the depth of channel 24 can be controlled to be of a "thin" depth, in the range of 10 nm to 100 nm. According to one advantage of a method as set forth herein a depth of channel 24 can be controlled to a specified depth within a wide range of candidate depths as opposed to being limited by a predetermined layer thickness as in the case of an ETSOI device. Depth of channel 24 can be controlled e.g., by control of the energy level of the oxygen implantation or varying a dosage of oxygen ion implantation and zero or more additives with the implantation.

The providing of a local buried oxide region 22 in a bulk silicon substrate 16 aligned to a gate 14 provides numerous advantages. For example, a field effect channel with such a structure is a thin silicon body partially delimited by the local buried oxide region 12 and thus can achieve the leakage current inhibiting performance on the order of that seen with an extremely thin silicon insulator (ETSOI) device. In addition, sources and drains 20 and 22 are formed in bulk silicon 16 and accordingly, the stressor material on source and drain 20 and 22 can effectively induce stress in channel 24. In addition the extension and Halo ion implantation processes which are critical in a bulk CMOS flow of prior art may be eliminated due to the existence of local buried oxide region 12. The presence of local buried oxide region 12 can yield a thin depth channel 24 and accordingly can reduce a short channel effect. As a result, in one embodiment, as illustrated in FIG. 1 source and drain 20 and 22 can be devoid of extensions, 20ex and 22ex which are typical features of a bulk Si device to address a short channel effect. Also as illustrated in the embodiment of FIG. 1, device 10 can be absent of Halo implants which in one embodiment can occupy a portion of an area of local buried oxide region 12. Halos implants are typical features of reduction of punch-through leakage current between source and drain (i.e., one of a short channel effect). A function of source and drain deep regions 20dr and 22dr as set forth in FIG. 12 is to provide a low resistance contact. In one embodiment, (n-type or p-type) wells on a Si substrate 16 can still provide electrical bias with respect to the source/drain 20 and 22.

While gate electrode 14e and gate dielectric 14d are set forth herein in one embodiment as having a single layer, gate electrode 14e and gate dielectric 14d can include one or more layers. In one example gate electrode 14e can include multiple conducting layers, e.g., TiN, TaN, TiAl, TiC, Al, and W, (e.g., to set the correct "work function" in advanced CMOS technology nodes). Also, the gate dielectric 14d may also be multiple layers of dielectric, e.g., high-k and $SiO_2$, for better capacitive coupling to channel 24 and smaller leakage between the gate electrode 14e and channel 24. The combination of one or more layer of a gate electrode and one or more layer of a gate dielectric can be regarded as a "gate stack".

Figure 13:
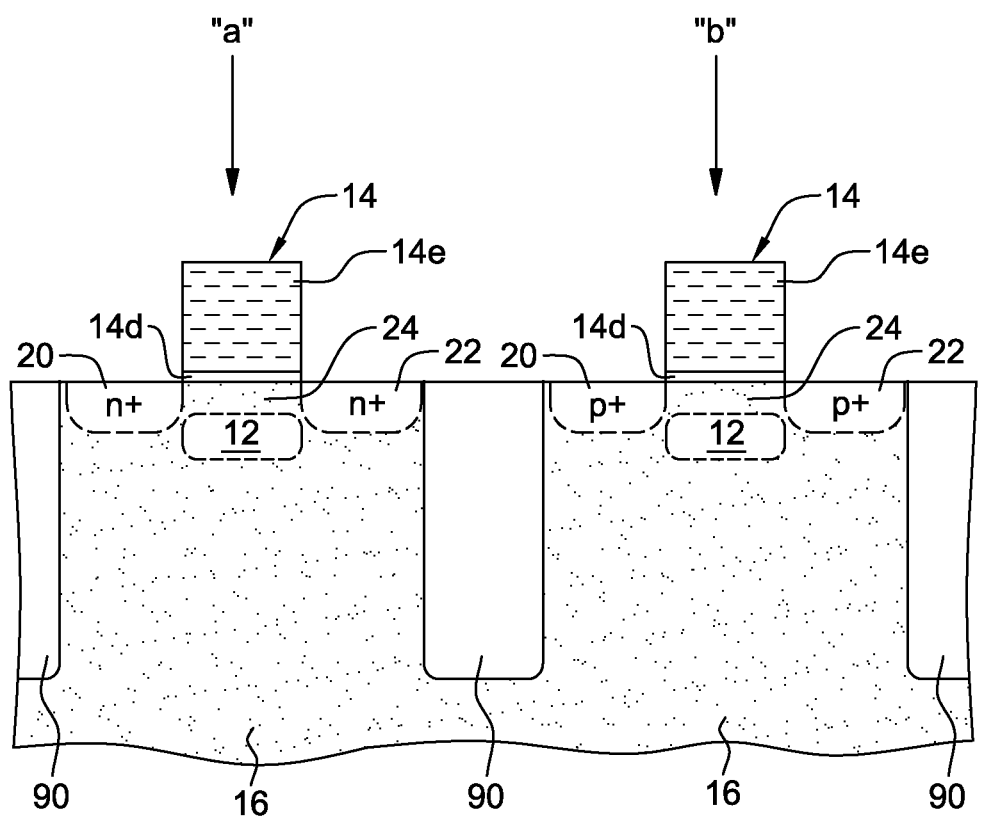
FIG. 13 is a side view schematic diagram illustrating a semiconductor device.

Referring to FIG. 13, device 10 is provided as a bulk Si wafer defining a plurality field effect transistors (FETs) each FET, e.g., at location "a" and "b" of device 10 having a gate 14 and a local buried oxide region 12 aligned to each gate 14. In the embodiment of FIG. 13, device 10 can include both one, or more NFET, e.g., at location "a" and one or more PFET, e.g., at location "b". Shallow trench isolation (STI) regions 90 can separate the various FETs.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

The invention claimed is:

1. A semiconductor device comprising:
   a substrate;
   a gate disposed over the substrate;
   a local buried oxide region formed in the substrate such that the buried oxide region is formed entirely under the gate, the buried oxide region is dispose between vertically extending planes of sidewalls of the gate and the buried oxide region does not extend outwardly laterally beyond the vertically extending planes;
   a channel defined in the substrate between the gate and the local buried oxide region, the channel having a first end and a second end;
   a source defined at the first end of the channel; and
   a drain defined at the second end of the channel.

2. The semiconductor device of claim 1, wherein one or more of the source and drain includes an extension.

3. The semiconductor device of claim 1, wherein one or more of the source and drain includes means for reducing a short channel effect.

4. A method comprising:
   forming a local buried oxide region in a substrate;
   fabricating a gate at a location aligned with the local buried oxide region such that the local buried oxide region is located entirely under an area of the gate, the buried oxide region is dispose between vertically extending planes of sidewalls of the gate and the buried oxide region does not extend outwardly laterally beyond the vertically extending planes.

5. The method of claim 4, wherein the forming includes ion implantation of oxygen.

6. The method of claim 4, wherein the forming includes ion implantation of oxygen with one or more of N, C or F.

7. The method of claim 4, wherein the fabricating includes using a gate first fabrication process.

8. The method of claim 4, wherein the fabricating includes using a gate last fabrication process.

9. A method comprising:
   providing a substrate having a deposited insulation layer thereon;
   gate patterning the insulation layer so that a gate area and channel area are defined by an open area of a photoresist mask;
   removing a portion of the insulation layer to define a gate area and an exposed channel area of the substrate;
   forming a local buried oxide region in an area of the substrate aligned to the gate area and the channel area such that the local buried oxide region is disposed entirely under an area of the gate, the buried oxide region is dispose between vertically extending planes of sidewalls of the gate and the buried oxide region does not extend outwardly laterally beyond the vertically extending planes;
   annealing the local buried oxide region;
   applying a dielectric layer on the channel area;
   disposing gate electrode material in the gate area;
   planarizing the gate forming material; removing the insulation layer: and
   performing one of gate first and gate last processes to define a field effect transistor (FET) having a gate, source, and drain.

10. The method of claim 9, wherein the insulation layer is provided by SiN.

11. The method of claim 9, wherein the forming includes ion implantation of oxygen.

12. The method of claim 9, wherein the forming includes ion implantation of oxygen with one or more of N, C and-or F.

13. The method of claim 9, wherein the performing is absent of processes for formation of source and drain extensions.

14. The method of claim 9, wherein the performing is absent of processes for formation of source and drain Halos.

15. The semiconductor device of claim 1, wherein the local buried oxide region is formed under the gate and the channel but not under the source and drain.

16. The method of claim 4, wherein the forming a local buried oxide region is performed prior to the fabricating a gate.

17. The method of claim 4, wherein the method includes forming a source and drain, and wherein the fabricating a gate includes fabricating the gate so that the local buried oxide region is located under an area of the gate but not under an area of the source and drain.

18. The method of claim 9, wherein the forming a local buried oxide region includes forming the local buried oxide region under an area of the gate but not under an area of the source and drain.

19. The method of claim 4, wherein the fabricating a gate includes fabricating a gate at a location aligned with lateral ends of the local buried oxide region.

20. The method of claim 19, wherein the lateral ends of the local buried oxide regions are spaced apart from lateral ends of the substrate.

21. The method of claim 4, wherein the forming a local buried oxide region includes performing oxygen implantation in a localized area through a patterned mask.

22. The method of claim 21, wherein the fabricating the gate includes using the patterned mask.

* * * * *